US012770688B2

(12) United States Patent
Shin et al.

(10) Patent No.: US 12,770,688 B2
(45) Date of Patent: Oct. 20, 2026

(54) MEMORY DEVICE PERFORMING PROGRAM OPERATION AND METHOD OF OPERATING THE SAME

(71) Applicant: SK hynix Inc., Icheon-si (KR)

(72) Inventors: Hyun Seob Shin, Icheon-si (KR); Dong Hun Kwak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 583 days.

(21) Appl. No.: 18/331,689

(22) Filed: Jun. 8, 2023

(65) Prior Publication Data

US 2024/0185922 A1 Jun. 6, 2024

(30) Foreign Application Priority Data

Dec. 5, 2022 (KR) ........................ 10-2022-0167720

(51) Int. Cl.

*G11C 16/10* (2006.01)
*G11C 11/56* (2006.01)
*G11C 16/04* (2006.01)
*G11C 16/34* (2006.01)

(52) U.S. Cl.

CPC .......... *G11C 16/10* (2013.01); *G11C 11/5628* (2013.01); *G11C 11/5671* (2013.01); *G11C 16/0491* (2013.01); *G11C 16/3459* (2013.01)

(58) Field of Classification Search

CPC . G11C 16/10; G11C 11/5628; G11C 11/5671; G11C 16/0491; G11C 16/3459

USPC ........................................................ 365/185.03

See application file for complete search history.

(56) References Cited

U.S. PATENT DOCUMENTS

2022/0044730 A1* 2/2022 Kim ...................... G11C 16/10

FOREIGN PATENT DOCUMENTS

KR 1020100107291 A 10/2010
KR 1020210144190 A 11/2021

* cited by examiner

*Primary Examiner* — Hoai V Ho

(74) *Attorney, Agent, or Firm* — WILLIAM PARK AND ASSOCIATES LTD.

(57) ABSTRACT

A semiconductor memory device includes a memory block, a peripheral circuit, and a control logic. The memory block includes memory cells. The peripheral circuit performs a program operation including program loops on selected memory cells. The control logic controls the peripheral circuit to apply a program inhibit voltage to bit lines connected to memory cells of a first group of target states, apply the program inhibit voltage to bit lines connected to memory cells on which programming is determined to be completed in a previous program loop, among memory cells of a second group of target states, and apply a program allowable voltage to bit lines connected to memory cells on which programming is determined to not be completed in the previous program loop, among the memory cells of the second group of target states. The first and second groups are determined by a number of current program loops.

18 Claims, 17 Drawing Sheets

MEMORY DEVICE PERFORMING PROGRAM OPERATION AND METHOD OF OPERATING THE SAME

CROSS-REFERENCE TO RELATED APPLICATION

The present application claims priority under 35 U.S.C. § 119(a) to Korean patent application number 10-2022-0167720 filed on Dec. 5, 2022, in the Korean Intellectual Property Office, the entire disclosure of which is incorporated by reference herein.

BACKGROUND

1. Technical Field

The present disclosure relates to an electronic device, and more particularly, to a semiconductor memory device performing a program operation and a method of operating the same.

2. Related Art

A semiconductor memory device may be formed in a two-dimensional structure in which a string is horizontally arranged on a semiconductor substrate or a three-dimensional structure in which a string is vertically stacked on a semiconductor substrate. The three-dimensional memory device is a memory device designed to resolve an integration degree limit of the two-dimensional memory device and may include a plurality of memory cells stacked in a vertical direction on the semiconductor substrate.

During a program operation of the semiconductor memory device, a threshold voltage of a memory cell storing different data is programmed to be included in different threshold voltage states. For example, single-level cells (SLCs) storing one bit data are programmed to belong to any one of two different threshold voltage states according to corresponding bit data. As another example, multi-level cells (MLCs) storing two bit data are programmed to belong to any one of four different threshold voltage states according to corresponding bit data.

For program of a selected memory cell, a program voltage is applied to a word line connected to the selected memory cell, and a program pass voltage is applied to word lines connected to unselected memory cell. In addition, a program allowable voltage or a program inhibit voltage is selectively applied to bit lines respectively connected to the selected memory cells.

SUMMARY

According to an embodiment of the present disclosure, a semiconductor memory device includes a memory block, a peripheral circuit, and a control logic. The memory block includes a plurality of memory cells. The peripheral circuit performs a program operation including a plurality of program loops on selected memory cells among the plurality of memory cells. The control logic, in a process of setting a voltage of a bit line connected to the selected memory cells during the program operation, controls the peripheral circuit to apply a program inhibit voltage to a bit line connected to memory cells corresponding to a target program state of a first group determined by a number of current program loops, apply the program inhibit voltage to a bit line connected to memory cells on which programming is determined to be completed in a previous program loop, among memory cells corresponding to a target program state of a second group determined by the number of current program loops, and apply a program allowable voltage to a bit line connected to memory cells on which programming is determined to not be completed in the previous program loop, among the memory cells corresponding to the target program state of the second group determined by the number of current program loops.

According to an embodiment of the present disclosure, a method of operating a memory device includes applying a program pulse to selected memory cells in a state in which memory cells corresponding to a target program state of a first group determined by a number of current program loops among a plurality of program loops are set as program inhibit cells, and performing a verify operation on the selected memory cells.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a semiconductor memory device and a method of operating the same capable of improving a threshold voltage distribution of memory cells in a program operation.

The present technology may provide a semiconductor memory device and a method of operating the same capable of improving a threshold voltage distribution of memory cells in a program operation.

Figure 1:
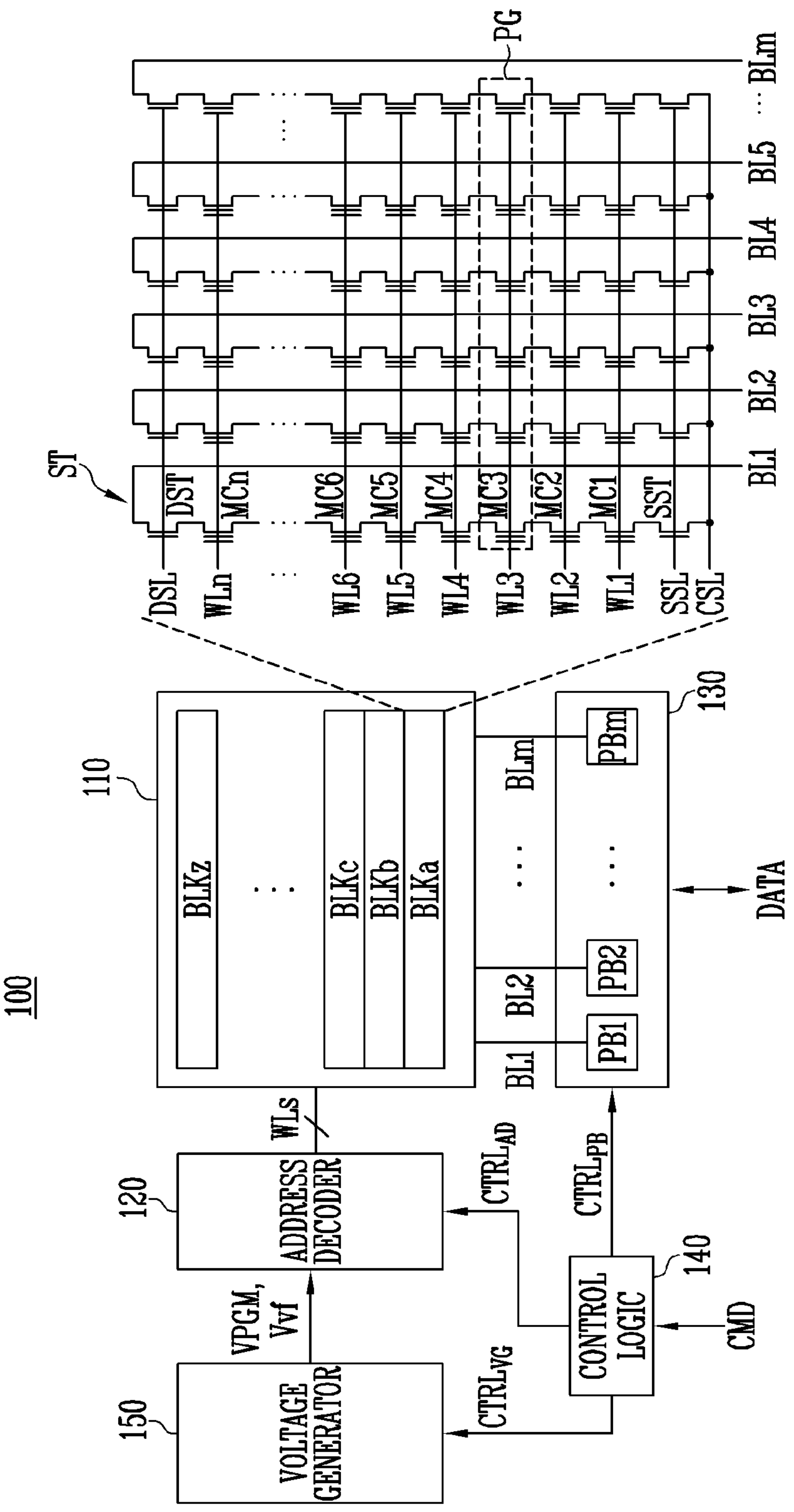
FIG. 1 is a diagram illustrating a semiconductor memory device according to an embodiment of the present disclosure.

FIG. 1 is a diagram illustrating a semiconductor memory device according to an embodiment of the present disclosure.

Referring to FIG. 1, the semiconductor memory device 100 may include a memory cell array 110, an address decoder 120, a read and write circuit 130, a control logic 140, and a voltage generator 150.

The memory cell array 110 may include a plurality of memory blocks BLKa to BLKz. The plurality of memory blocks BLKa to BLKz may be connected to the address decoder 120 through word lines WLs. The plurality of memory blocks BLKa to BLKz may be connected to the read and write circuit 130 through bit lines BL1 to BLm. Each of the plurality of memory blocks BLKa to BLKz may include a plurality of memory cells. As an embodiment, the plurality of memory cells may be configured as nonvolatile memory cells.

FIG. 1 shows a structure of a memory block BLKa, among the plurality of memory blocks BLKa to BLKz, included in the memory cell array. Referring to FIG. 1, the plurality of word lines WL1 to WLn arranged in parallel with each other may be arranged between a drain select line DSL and a source select line SSL. More specifically, the memory block BLKa may include a plurality of strings ST connected between the bit lines BL1 to BLm and a common source line CSL. The bit lines BL1 to BLm may be connected to the corresponding strings ST, respectively, and the common source line CSL may be commonly connected to the strings ST. Since the strings ST may be configured identically to each other, the string ST connected to the first bit line BL1 is specifically described as an example.

The string ST may include a source select transistor SST, a plurality of memory cells MC1 to MCn, and a drain select transistor DST connected in series between a common source line CSL and the first bit line BL1. One string ST may include at least one source select transistor SST and at least one drain select transistor DST.

A source of the source select transistor SST may be connected to a common source line CSL and a drain of the drain select transistor DST may be connected to the first bit line BL1. The memory cells MC1 to MCn may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MCn may be connected to the plurality of word lines WL1 to WLn. A group of the memory cells connected to the same word line among the memory cells included in different strings ST may be referred to as a physical page PG. Therefore, the memory block BLKa may include the pages PG of the number of the word lines WL1 to WLn.

One memory cell may store one bit of data. This is commonly referred to as a single level cell (SLC). In this case, one physical page PG may store one logical page (LPG) data. The one logical page (LPG) data may include bits of data of the same number as cells included in one physical page PG.

Meanwhile, one memory cell may store two or more bits of data. In this case, one physical page PG may store two or more logical page (LPG) data.

In FIG. 1, a structure of a two-dimensional memory block is shown, but the present disclosure is not limited thereto. That is, each of the memory blocks BLKa to BLKz of FIG. 1 may be configured as a three-dimensional memory block.

The address decoder 120, the read and write circuit 130, and the voltage generator 150 operate as a peripheral circuit that drives the memory cell array 110. Based on control of the control logic 140, the peripheral circuit may perform a read operation, a program operation, and an erase operation on the memory cell array 110. The address decoder 120 may be connected to the memory cell array 110 through the word lines WLs. The address decoder 120 may be configured to operate in response to the control of the control logic 140. Specifically, the control logic 140 may transfer an address decoding control signal $CTRL_{AD}$ to the address decoder 120, and the address decoder 120 may perform a decoding operation based on the address decoding control signal $CTRL_{AD}$.

In addition, during the program operation, the address decoder 120 may apply a program voltage VPGM generated by the voltage generator 150 to a selected word line and may apply a program pass voltage to remaining unselected word lines. In addition, during a program verify operation, the address decoder 120 may apply a verify voltage Vvf generated by the voltage generator 150 to the selected word line and may apply a verify pass voltage to the remaining unselected word lines.

The read and write circuit 130 may include a plurality of page buffers PB1 to PBm. The read and write circuit 130 may operate as a "read circuit" during the read operation of the memory cell array 110 and may operate as a "write circuit" during a write operation of the memory cell array 110. The plurality of page buffers PB1 to PBm may be connected to the memory cell array 110 through the bit lines BL1 to BLm. The read and write circuit 130 may perform the program operation on received data DATA in response to a page buffer control signal $CTRL_{PB}$ output from the control logic 140.

The control logic 140 may be connected to the address decoder 120, the read and write circuit 130, and the voltage generator 150. The control logic 140 may receive a command CMD from an external device. The control logic 140 may control the address decoder 120, the read and write circuit 130, and the voltage generator 150 to perform an operation corresponding to the received command CMD. That is, the control logic 140 may control an operation of the voltage generator 150 through a voltage generation control signal $CTRL_{VG}$. In addition, the control logic 140 may control an operation of the address decoder 120 through the address decoding control signal $CTRL_{AD}$. Meanwhile, the control logic 140 may control an operation of the page buffers PB1 to PBm in the read and write circuit 130 through the page buffer control signal $CTRL_{PB}$.

The voltage generator 150 may generate various operation voltages in response to the voltage generation control signal $CTRL_{VG}$ output from the control logic 140. For example, the voltage generator 150 may generate the program voltage VPGM used for the program operation and the verify voltage Vvf used for the program verify operation. In addition, the voltage generator 150 may generate the program pass voltage and the verify pass voltage.

The program operation may be performed in a page unit. Memory cells commonly connected to one word line may configure a physical page. In an embodiment, the physical page may include at least one or more logical pages. Therefore, page data, which is data stored in the physical page, may include at least one or more plurality of logical page data. For example, when a memory cell is programmed in an SLC mode, the physical page may include one logical page, and the page data may include one logical page data. Alternatively, when the memory cell is programmed in a multi-level cell (MLC) mode, the physical page may include two logical pages, and the page data may include two logical page data. At this time, the two logical page data may be a least significant bit (LSB) page data and a most significant bit (MSB) page data. Alternatively, when the memory cell is programmed in a TLC mode, the physical page may include three logical pages, and the page data may include three logical page data. At this time, the three logical page data may be a least significant bit (LSB) page data, a central significant bit (CSB) page data, and a most significant bit (MSB) page data.

Figure 9:
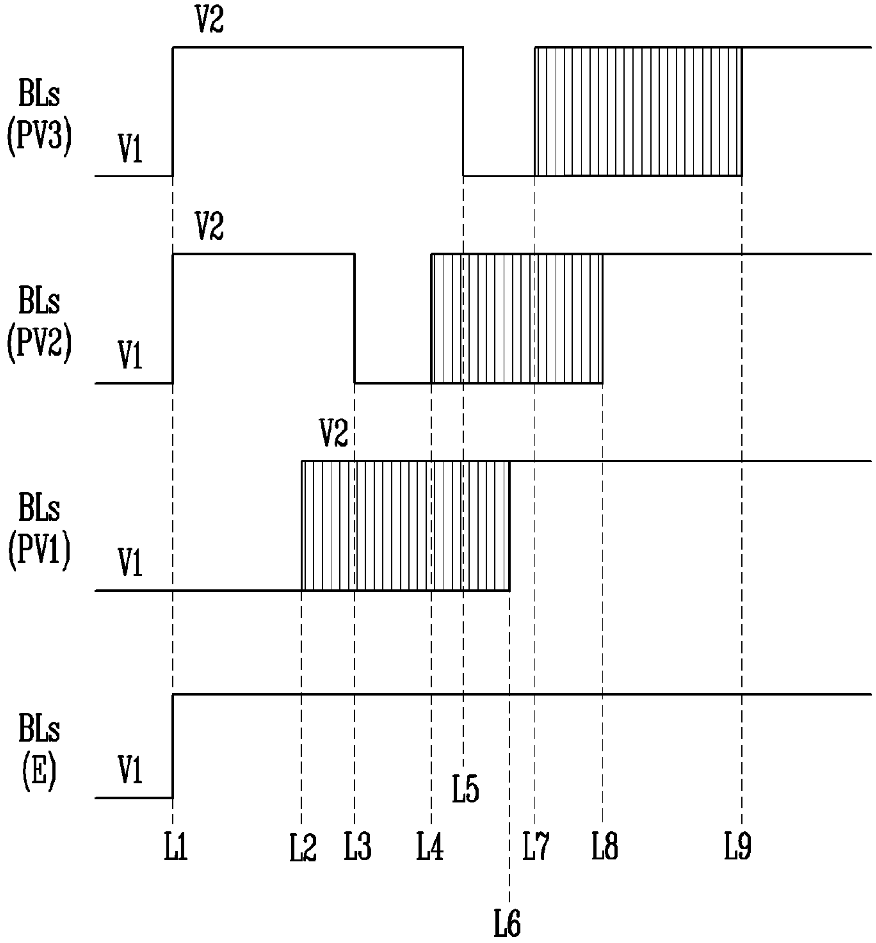
FIG. 9 is a timing diagram illustrating the embodiment shown in FIG. 8.

Before the program operation is performed, memory cells may have a threshold voltage corresponding to an erase state E (refer to FIG. 9). When the program operation is performed, memory cells included in a selected page may have a threshold voltage corresponding to any one state, among the erase state E and first to third program states PV1 to PV3 (refer to FIG. 9), according to data stored in each memory cell. During the program verify operation, verify voltages Vvf1, Vvf2, and Vvf3 may be used. For example, it may be determined whether program of a corresponding memory cell is completed by determining whether a threshold voltage of a memory cell targeting the first program state PV1 is greater than the first verify voltage Vvf1. Among memory cells to be programmed to the first program state PV1, a program inhibit voltage may be applied to a bit line connected to the memory cells having the threshold voltage greater than the first verify voltage Vvf1. In addition, among the memory cells to be programmed to the first program state PV1, a program allowable voltage may be applied to a bit line connected to memory cells having a threshold voltage less than the first verify voltage Vvf1. The program inhibit voltage may be a voltage greater than the program allowable voltage. In an embodiment, the program inhibit voltage may be a power voltage. In an embodiment, the program allowable voltage may be a ground voltage.

While the program voltage is applied to the selected word line, the threshold voltage of the memory cells connected to the bit line to which the program inhibit voltage is applied may be maintained. Meanwhile, while the program voltage is applied to the selected word line, the threshold voltage of the memory cells connected to the bit line to which the program allowable voltage is applied may increase.

Hereinafter, for convenience of description, it is assumed that the memory cell is programmed in the MLC mode. However, this is for convenience of description, and an embodiment of the present disclosure is not limited thereto.

The program operation of the semiconductor memory device may include a plurality of program loops. Specifically, a first program loop $1^{st}$ PGM loop may be first performed during the program operation of the semiconductor memory device. After the first program loop $1^{st}$ PGM Loop is performed, when programming memory cells included in the selected page is not completed, a second program loop $2^{nd}$ PGM Loop may be performed. After the second program loop $2^{nd}$ PGM Loop is performed, when the program of the memory cells included in the selected page is not completed, a third program loop $3^{rd}$ PGM Loop may be performed. In the method described above, a plurality of program loops may be repeatedly performed until the program of the memory cells included in the selected page is completed or a maximum program loop is reached.

Each of the plurality of program loops may include a program pulse apply step and a program verify step. In the program pulse apply step, the program voltage may be applied to the selected word line to increase a threshold voltage of program allowable cells.

In the program verify step, as described above, it may be verified whether memory cells selected as program objects is programmed to a desired level of a verify voltage or greater. As a result of the verify operation, a memory cell that is not programmed to the verify voltage or greater may operate as the program allowable cell in a next program loop. At this time, a program pulse having a voltage level greater than that of a previous program loop may be applied to the program allowable cells. Meanwhile, a memory cell programmed to the verify voltage or greater may operate as a program inhibit cell in the next program loop. Even though the program pulse is applied to the selected word line, a threshold voltage of the program inhibit cell might not increase.

Figure 2:
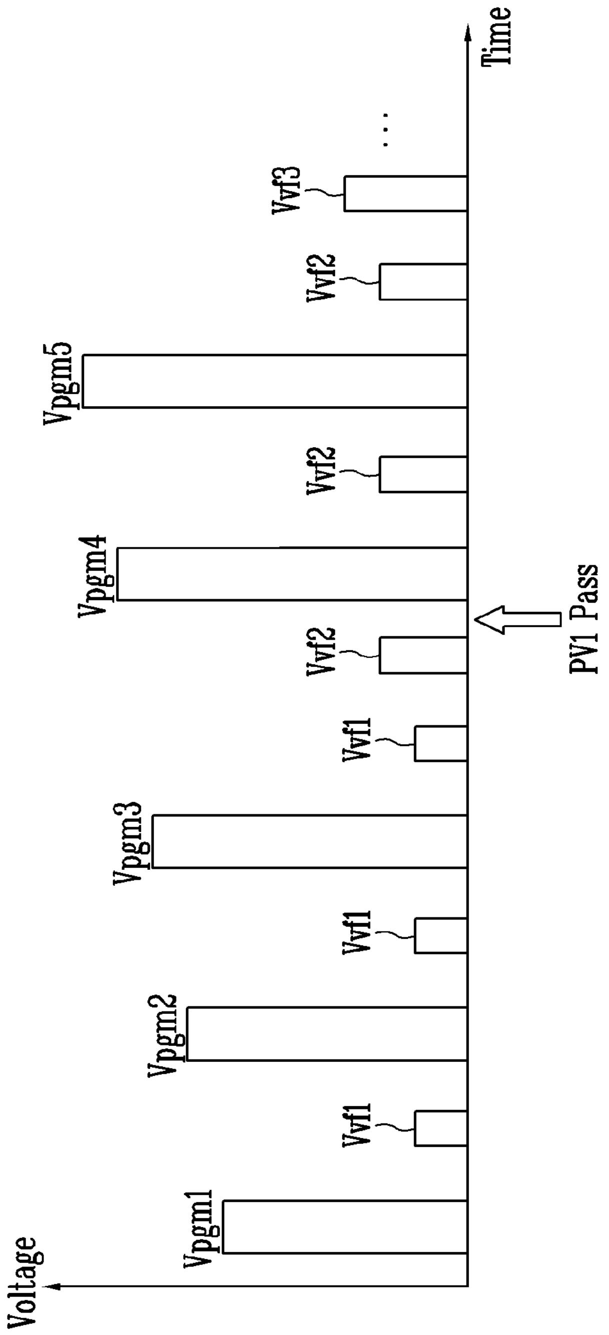
FIG. 2 is a diagram illustrating a voltage applied to a selected word line during a program operation.

FIG. 2 is a diagram illustrating a voltage applied to the selected word line during the program operation.

Referring to FIG. 2, a program operation for forming a program state of an MLC may include a plurality of program loops.

Referring to FIG. 2, in a program pulse apply step of a first program loop, a first program voltage Vpgm1 is applied to the selected word line. In addition, in a verify step of the first program loop, the first verify voltage Vvf1 may be applied to the selected word line. As described above, memory cells programmed to the second and third program states might not exist at the beginning of the program operation. Accordingly, the verify operation may be performed using only the first verify voltage Vvf1 in the first program loop $1^{st}$ PGM Loop.

Thereafter, a second program voltage Vpgm2 may be applied to the selected word line in a program pulse apply step of a second program loop, and the first verify voltage Vvf1 may be applied to the selected word line in the verify step.

Thereafter, a third program voltage Vpgm3 may be applied to the selected word line in a program pulse apply step of a third program loop. In addition, the first verify voltage Vvf1 and the second verify voltage Vvf2 may be applied to the selected word line in a verify step of the third program loop.

Referring to FIG. 2, as a result of performing the verify step of the third program loop, verification on the first program state PV1 may pass. Therefore, the first verify voltage Vvf1 might not be used in subsequent program loops. Accordingly, a fourth program voltage Vpgm4 may be applied to the selected word line in a program pulse apply step of a fourth program loop, and the second verify voltage Vvf2 may be applied to the selected word line in a verify step.

Thereafter, a fifth program voltage Vpgm5 may be applied to the selected word line in a program pulse apply step of a fifth program loop. In addition, the second verify voltage Vvf2 and the third verify voltage Vvf3 may be applied to the selected word line in a verify step of the fifth program loop. In the method described above, program loops may be repeatedly performed until verification of the second program state PV2 and the third program state PV3 passes.

Figure 3:
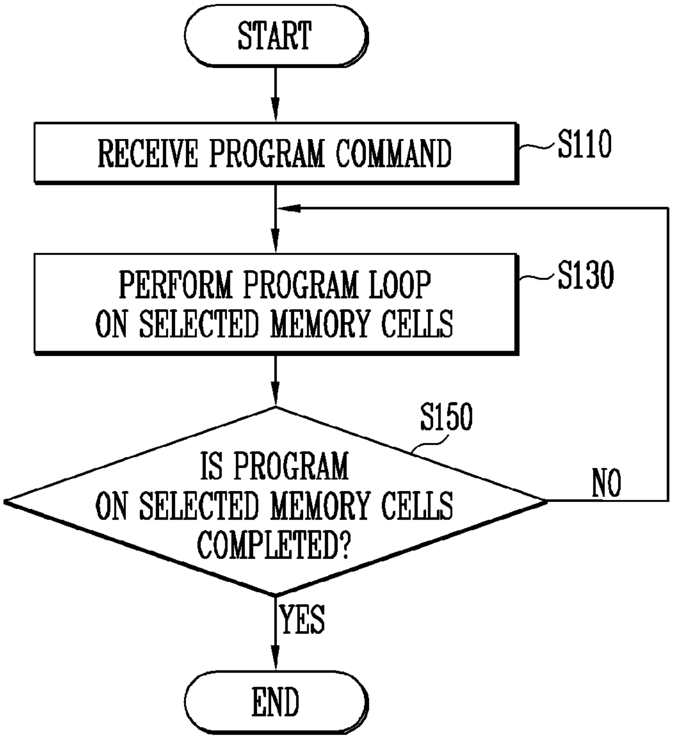
FIG. 3 is a flowchart illustrating a method of operating a semiconductor memory device according to an embodiment of the present disclosure.

FIG. 3 is a flowchart illustrating a method of operating a semiconductor memory device according to an embodiment of the present disclosure.

Referring to FIG. 3, a method of operating a semiconductor memory device according to an embodiment of the present disclosure includes receiving a program command (S110), performing a program loop on selected memory cells (S130), and determining whether program on the selected memory cells is completed (S150).

In step S110, the semiconductor memory device 100 may receive a program command from the external device. As an example, the semiconductor memory device 100 may receive the program command from a controller or a host. Together with the program command, the semiconductor memory device 100 may receive program data and a program address together in step S110. The semiconductor memory device 100 may start an operation of programming the program data to memory cells corresponding to the program address in response to the received program command.

In step S130, the peripheral circuit of the semiconductor memory device 100 may perform a program loop for programming the program data to the selected memory cells based on the program address under the control of the control logic 140. In an embodiment, one program loop may include a program pulse apply step and a program verify step.

In step S150, the control logic 140 of the semiconductor memory device 100 may determine whether programming the selected memory cells is completed by the program loop performed in step S130. When programming the selected memory cells is completed (S150: Yes), the program operation may be ended. When programming the selected memory cells is not completed (S150: No), a subsequent program loop may be performed by returning to step S130.

Figure 4:
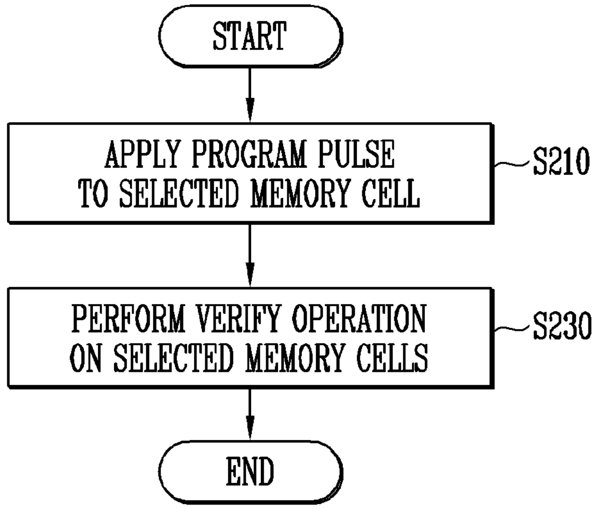
FIG. 4 is a flowchart illustrating an embodiment of step S130 of FIG. 3.

FIG. 4 is a flowchart illustrating an embodiment of step S130 of FIG. 3.

Referring to FIG. 4, performing the program loop on the selected memory cells (S130) may include applying a program pulse to the selected memory cells (S210) and performing a verify operation on the selected memory cells (S230). Embodiments of step S210 are described later with reference to FIGS. 5, 7, 14, and the like. Meanwhile, an embodiment of step S230 is described later with reference to FIG. 6.

Figure 5:
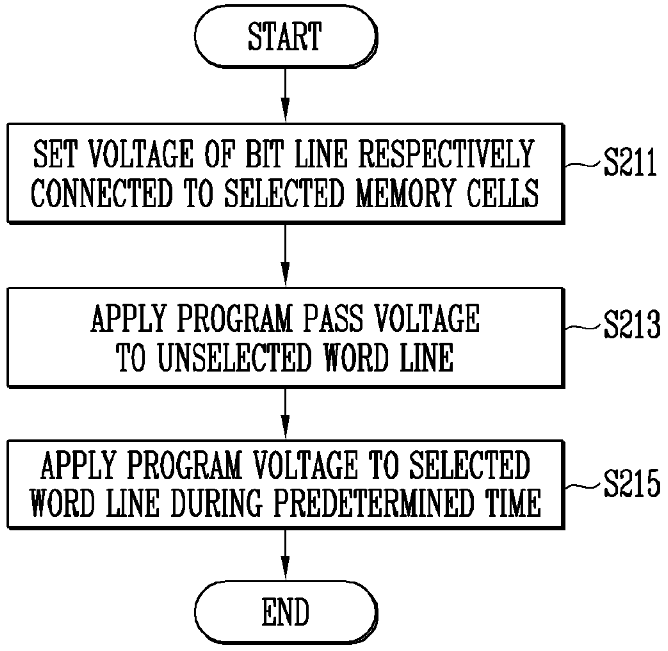
FIG. 5 is a flowchart illustrating an embodiment of step S210 of FIG. 4.

FIG. 5 is a flowchart illustrating an embodiment of step S210 of FIG. 4.

Referring to FIG. 5, applying the program pulse to the selected memory cells may include setting a voltage of a bit line respectively connected to the selected memory cells (S211), applying a program pass voltage to an unselected word line (S213), and applying a program voltage to a selected word line during a predetermined time (S215).

In step S211, the voltage of the bit line respectively connected to the selected memory cells may be set. For example, in step S211, the program allowable voltage may be applied to the bit line connected to the program allowable cell, and the program inhibit voltage may be applied to the bit line connected to the program inhibit cell. Through this, a bit line voltage according to the program state of each of the selected memory cells may be set. Exemplary embodiments of step S211 are described later with reference to FIGS. 7 and 8.

In step S213, the program pass voltage may be applied to the unselected word line. Among word lines connected to a memory block including the selected memory cells, a word line connected to the selected memory cells may become the selected word line, and other word lines may become the unselected word lines. As the program pass voltage is applied to the unselected word lines, a threshold voltage of the memory cells connected to the unselected word lines might not change.

In step S215, the program voltage may be applied to the selected word line during a predetermined time. The program voltage applied to the selected word line during the predetermined time may configure a program pulse. Accordingly, a threshold voltage of the program allowable cell connected to the bit line to which the program allowable voltage is applied, among the selected memory cells, may increase. In addition, a threshold voltage of the program inhibit cell connected to the bit line to which the program inhibit voltage is applied, among the selected memory cells, may be maintained.

Figure 6:
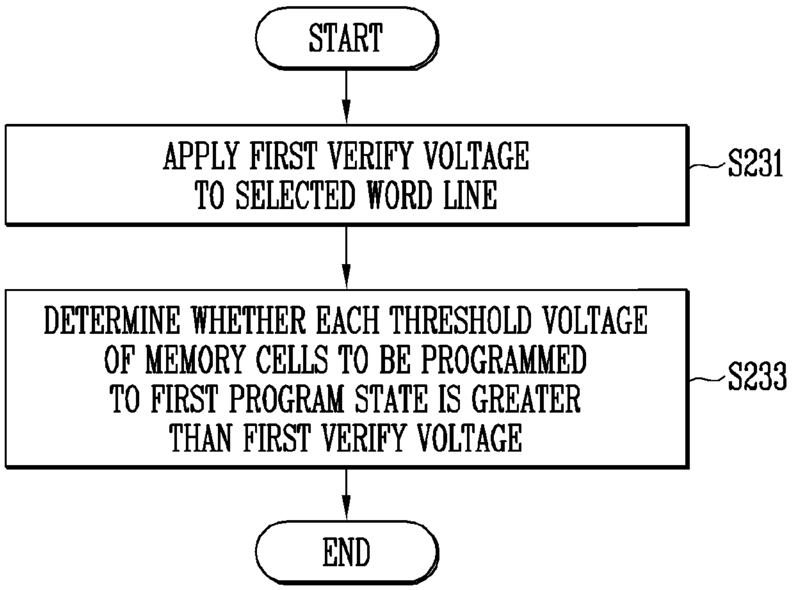
FIG. 6 is a flowchart illustrating an embodiment of step S230 of FIG. 4.

FIG. 6 is a flowchart illustrating an embodiment of step S230 of FIG. 4.

In FIG. 6, an exemplary embodiment of the verify step using the first verify voltage is shown, but the present disclosure is not limited thereto. That is, the verify step using the second or third verify voltage may also be performed similarly to that shown in FIG. 6.

Referring to FIG. 6, performing the verify operation on the selected memory cells (S230) may include applying the first verify voltage to the selected word line (S231) and determining whether a threshold voltage of each of the memory cells to be programmed to a first program state is greater than the first verify voltage (S233).

In step S231, the first verify voltage Vvf1 corresponding to the first program state PV1, which is a target program state, may be applied to the selected word line. Meanwhile, in step S231, the verify pass voltage may be applied to the unselected word line.

Thereafter, in step S233, each of the page buffers of the peripheral circuit may sense whether the threshold voltage of each of the selected memory cells is greater than the first verify voltage Vvf1 through the bit lines and may store a sensing result in a latch of the page buffer. Among the memory cells to be programmed to the first program state, the memory cell having the threshold voltage greater than the first verify voltage Vvf1 may become the program inhibit cell in a subsequent program loop. In addition, among the memory cells to be programmed to the first program state, the memory cell having the threshold voltage less than the first verify voltage Vvf1 may become the program allowable cell in the subsequent program loop.

Figure 7:
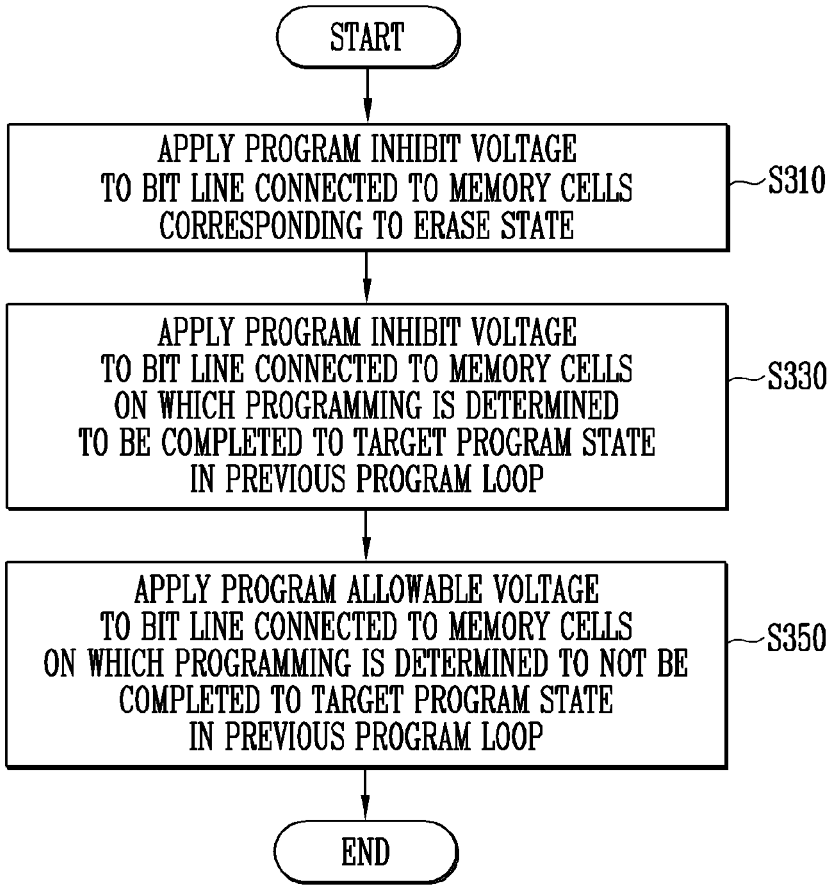
FIG. 7 is a flowchart illustrating an embodiment of step S211 of FIG. 5.

FIG. 7 is a flowchart illustrating an embodiment of step S211 of FIG. 5.

Referring to FIG. 7, setting the voltage of the bit lines respectively connected to the selected memory cells (S211) may include applying a program inhibit voltage to a bit line connected to memory cells corresponding to an erase state E (S310), applying a program inhibit voltage to a bit line connected to memory cells on which programming is determined to be completed to a target program state in a previous program loop (S330), and applying a program allowable voltage to a bit line connected to memory cells on which programming is determined to not be completed to the target program state in the previous program loop (S350).

In step S310, the program inhibit voltage may be applied to the bit line connected to the memory cells of which a target state is the erase state E, among the selected memory cells. Since a threshold voltage of the memory cells of which the target state is the erase state E already belongs to a targeted state, the threshold voltage might not be required to be increased any more. Therefore, the program inhibit voltage may be applied to the bit line connected to the memory cells targeting the erase state E.

In step S330, the program inhibit voltage may also be applied to the bit line connected to the memory cells determined that the programming is completed to the target program state. The threshold voltage of the program inhibit cell on which programming is completed to the target program state might not be required to be increased any more. Therefore, the program inhibit voltage may be applied to the bit line connected to the memory cells on which programming is already completed to the target program state, similarly to the memory cells targeting the erase state E.

On the other hand, a threshold voltage of the memory cells on which programming is determined to not be completed to the target program state may be required to be increased. Therefore, in step S350, the program allowable voltage may be applied to the bit line connected to the program allowable cells on which programming is determined to not be completed to the target program state.

In FIG. 7, step S330 may be performed after performing step S310, and step S350 may be performed after performing step S330, but the present disclosure is not limited thereto. A precedence relationship of each of steps S310, S330, and S350, shown in FIG. 7, may be determined variously as occasion demands. Alternatively, each of steps S310, S330, and S350 shown in FIG. 7 may be performed simultaneously.

According to the embodiment shown in FIG. 7, the number of program inhibit cells increases as the number of program loops increases. Prior to the program operation, the memory cells have the threshold voltage of the erase state. As the program operation is progressed, the memory cells on which programming is completed to the first program state PV1 may change to the program inhibit cells, and then each of the memory cells on which programming is completed to the second program state PV2 and the third program state PV3 may also change to the program inhibit cell.

The program inhibit voltage may be applied to the bit line connected to the program inhibit cell. Accordingly, since a channel of the program inhibit cell maintains a floating state, a capacitance between the channel and the word line of the program inhibit cell may be relatively small. This means that the entire capacitance value between the selected word line and the selected memory cells may decrease as the number of program inhibit cells increases.

As the number of program loops increases, the number of program inhibit cells may increase, and thus the entire capacitance value between the selected word line and the selected memory cells may decrease. This means that an RC delay occurring when a voltage is applied to the selected word line may be reduced, and this also means that a speed of a voltage appearing on the selected word line may be increased when the program voltage is applied.

Considering an ideal case in which the entire capacitance value between the selected word line and the selected memory cells does not decrease even though the number of program inhibit cells increases, since an RC delay value of the word line is constant, an increased speed of the threshold voltage of the memory cell that is a program allowable object may be gradually increased even though the number of program loops increases.

However, in an actual case, when the number of program inhibit cells increases, the speed of the voltage appearing on the selected word line may increase when the program voltage is applied. Therefore, as the number of program loops increases, a change in width of the threshold voltage of the memory cell may also steeply increase compared to that in the above-described ideal case. Accordingly, when the number of program loops increases, a movement width of the threshold voltage of the program allowable cell may increase excessively, more than a required amount. This may cause deterioration of a threshold voltage distribution characteristic of the entire memory cells when the program operation is completed.

According to an embodiment of the present disclosure, target program states may be divided into a first group and a second group according to the number of program loops. Thereafter, memory cells corresponding to a target program state belonging to the first group may be set as program inhibit cells regardless of whether or not programming is completed. Accordingly, the number of program inhibit cells according to an increase of the number of program loops may be smoothed. As a result, the RC delay of the word line according to the increase of the number of program loops may also be smoothed, and finally, the threshold voltage distribution characteristic of the memory cells may be improved.

Figure 8:
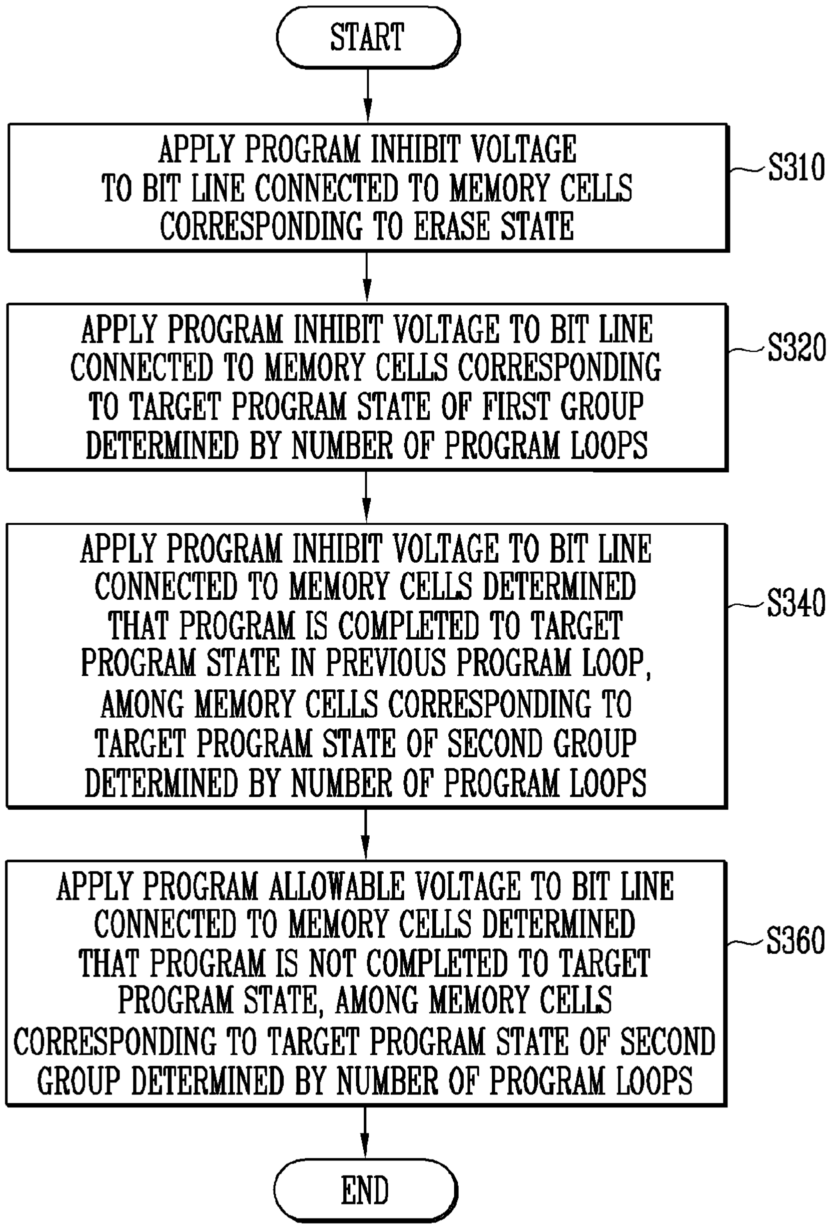
FIG. 8 is a flowchart illustrating another embodiment of step S211 of FIG. 5.

FIG. 8 is a flowchart illustrating another embodiment of step S211 of FIG. 5.

Referring to FIG. 8, setting the voltage of the bit line respectively connected to the selected memory cells (S211) may include applying a program inhibit voltage to a bit line connected to memory cells corresponding to an erase state E (S310), applying a program inhibit voltage to a bit line connected to memory cells corresponding to a target program state of a first group determined by the number of program loops (S320), applying a program inhibit voltage to a bit line connected to memory cells on which programming is determined to be completed to a target program state in a previous program loop, among memory cells corresponding to a target program state of a second group determined by the number of program loops (S340), and applying a program allowable voltage to a bit line connected to memory cells on which programming is determined to not be completed to the target program state in the previous program loop, among the memory cells corresponding to the target program state of the second group determined by the number of program loops (S360).

Since step S310 of FIG. 8 is substantially the same as step S310 of FIG. 7, overlapping descriptions may be omitted.

In step S320, the program inhibit voltage may be applied to the bit line connected to the memory cells corresponding to the target program state of the first group determined by the number of program loops. In the present specification, the memory cells corresponding to "the target program state of the first group" may be determined as the program inhibit cells regardless of whether or not programming is completed.

In an embodiment, at the beginning of the program operation, the target program state of the first group may include the second and third program states PV2 and PV3. Meanwhile, in the middle of the program operation, the target program state of the first group may include the third program state PV3. In addition, in the latter half of the program operation, the target program state of the first group might not include any program state.

Accordingly, at the beginning of the program operation, the memory cells corresponding to the second and third program states PV2 and PV3 may become the program inhibit cells. Meanwhile, in the middle of the program operation, the memory cells corresponding to the second program state PV2 may become the program allowable cells, and the memory cells corresponding to the third program state PV3 may maintain the program inhibit cells. In addition, in the latter half of the program operation, the memory cells corresponding to the third program state PV3 may become the program allowable cells.

In step S340, the program inhibit voltage may be applied to the bit line connected to the memory cells on which programming is determined to be completed to the target program state in the previous program loop, among the memory cells corresponding to the target program state of the second group determined by the number of program loops. The "target program state of the second group" may become a remaining program state other than "the target program state of the first group", among the first to third program states.

For example, at the beginning of the program operation, when the target program state of the first group includes the second and third program states PV2 and PV3, the target program state of the second group may include the first program state PV1. Meanwhile, in the middle of the program operation, when the target program state of the first group includes the third program state PV3, the target program state of the second group may include the first and second program states PV1 and PV2. In addition, in the latter half of the program operation, when the target program state of the first group does not include any program state, the target program state of the second group may include the first to third program states PV1 to PV3.

In the above-described example, in a program loop included in the beginning of the program operation, in step S340, the program inhibit voltage may be applied to the bit line connected to the memory cells on which programming is determined to be completed in the previous program loop, among the memory cells corresponding to the first program state PV1.

In step S360, the program allowable voltage may be applied to the bit line connected to the memory cells on which programming is determined to not be completed to the target program state in the previous program loop, among the memory cells corresponding to the target program state of the second group determined by the number of program loops. According to the above-described example, in the program loop included in the beginning of the program operation, in step S360, the program allowable voltage may be applied to the bit line connected to the memory cells on which programming is determined to not be completed in the previous program loop, among the memory cells corresponding to the first program state.

A performance order of each of steps S310, S320, S340, and S360, shown in FIG. 8, may be variously determined as occasion demands. In an embodiment, each of steps S310, S320, S340, and S360, shown in FIG. 8, may be performed simultaneously.

FIG. 9 is a timing diagram illustrating the embodiment shown in FIG. 8.

Referring to FIG. 9, a setting voltage of the bit line BL connected to the memory cells targeting the third program state PV3, the second program state PV2, the first program state PV1, and the erase state E in each program loop is shown. FIG. 9 shows only the voltage of the bit line set in setting the voltage of the bit line (S211) included in the program pulse apply step (S210) of each program loop rather than all voltage changes of each bit line in the entire program operation. Hereinafter, the present disclosure is described with reference to FIGS. 8 and 9 together.

First, in an initial program loop L1, among the plurality of program loops, the voltage of the bit line connected to the memory cells corresponding to the erase state E may change from a first voltage V1 to a second voltage V2 (S310). Since the threshold voltage of the memory cells corresponding to the erase state E is not required to be increased, the voltage of the bit line connected to the memory cells corresponding to the erase state E may be maintained as the second voltage V2 while the program operation is ended from the first program loop.

Meanwhile, in the loop L1, the program states belonging to the first group may be the second and third program states PV2 and PV3. Accordingly, in the loop L1, the voltage of the bit lines connected to the memory cells corresponding to the second and third program states PV2 and PV3 may change from the first voltage V1 to the second voltage V2 (S320).

On the other hand, in the loop L1, the first voltage V1 may be applied to the bit lines connected to the memory cells corresponding to the first program state PV1 belonging to the second group (S360).

In FIG. 9, the first voltage V1 may be the program allowable voltage, and the second voltage V2 may be the program inhibit voltage. In an embodiment, the first voltage V1 may be a ground voltage. In addition, in an embodiment, the second voltage V2 may be a power supply voltage.

Thereafter, in a loop L2, the memory cells having the threshold voltage greater than the first verify voltage Vvf1, among the memory cells to be programmed to the first program state PV1, may start to appear. Accordingly, the memory cells to be programmed to the first program state PV1 may change from the program allowable cells to the program inhibit cells after the loop L2. As a result, the voltage applied to the bit lines connected to the memory cells to be programmed to the first program state PV1 may change from the first voltage V1 to the second voltage V2 (S340). In a loop L6, program of the memory cells to be programmed to the first program state PV1 may be completed. Therefore, the second voltage V2 may be applied to all bit lines connected to the memory cells corresponding to the first program state PV1 after the loop L6.

In a loop L3, the program state belonging to the first group and the second group may be changed. Specifically, in the loop L3, the program state belonging to the first group may become the third program state PV3, and the program state belonging to the second group may become the first and second program states. That is, in the loop L3, the second program state PV2 may be changed from the first group to the second group. Accordingly, in the loop L3, the program allowable voltage may be applied to the bit line connected to the memory cells to be programmed to the second program state PV2 (S360). Meanwhile, in the loop L3, the voltage of the bit lines connected to the memory cells corresponding to the third program state PV3 may maintain the second voltage V2 (S320).

In a loop L4, the memory cells having the threshold voltage greater than the second verify voltage Vvf2, among the memory cells to be programmed to the second program state PV2, may start to appear. Accordingly, the memory cells to be programmed to the second program state PV2 may change from the program allowable cells to the program inhibit cells after the loop L4. As a result, after the loop L4, the voltage applied to the bit lines connected to the memory cells to be programmed to the second program state PV2 may change from the first voltage V1 to the second voltage V2 (S340). In a loop L8, program of the memory cells to be programmed to the second program state PV2 may be completed. Therefore, the second voltage V2 may be applied to all bit lines connected to the memory cells corresponding to the second program state PV2 after the loop L8.

In a loop L5, the program state belonging to the first group and the second group may be changed. Specifically, in the loop L5, a program state belonging to the first group might not exist, and the program state belonging to the second group may become the first to third program states. That is, in the loop L5, the third program state PV3 may be changed from the first group to the second group. Accordingly, in the loop L5, the program allowable voltage may be applied to the bit line connected to the memory cells to be programmed to the third program state PV3 (S360).

In a loop L7, the memory cells having the threshold voltage greater than the third verify voltage Vvf3, among memory cells to be programmed to the third program state PV3, may start to appear. Accordingly, after the loop L7, the memory cells to be programmed to the third program state PV3 may be changed from the program allowable cells to the program inhibit cells. As a result, after the loop L7, the voltage applied to the bit lines connected to the memory cells to be programmed to the third program state PV3 may change from the first voltage V1 to the second voltage V2 (S340). In a loop L9, program of the memory cells to be programmed to the third program state PV3 may be completed. Finally, the program operation on the selected memory cells may be ended in the loop L9.

Figure 10A:
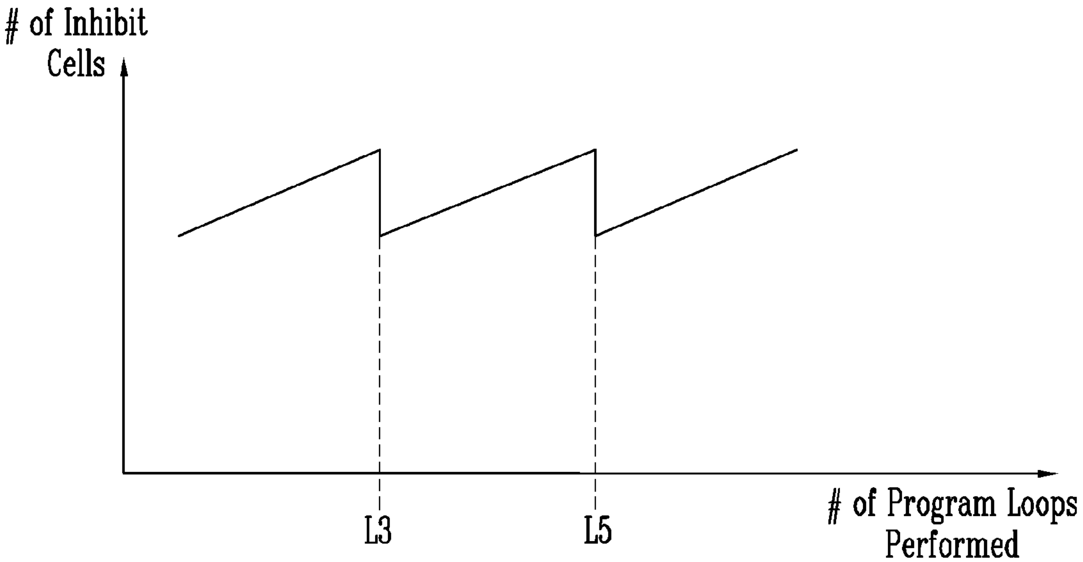
FIG. 10A is a graph illustrating a change of a program inhibit cell according to an increase of the number of program loops when memory cells are programmed according to FIGS. 8 and 9.

FIG. 10A is a graph illustrating a change of the program inhibit cell according to an increase of the number of program loops when the memory cells are programmed according to FIGS. 8 and 9.

Referring to FIGS. 9 and 10A, at the beginning of program, the memory cells corresponding to the erase state E and the second and third program states PV2 and PV3 may become the program inhibit cells, and the memory cells corresponding to the first program state PV1 may become the program allowable cells. As the number of program loops increases, the memory cells corresponding to the first program state PV1 may become the program inhibit cells, and thus the total number of program inhibit cells may increase. In the loop L3, the memory cells corresponding to the second program state PV2 may be changed from the program inhibit cells to the program allowable cells. Accordingly, the number of program inhibit cells may temporarily decrease in the loop L3. After the loop L3, as the number of program loops increases, the memory cells corresponding to the first and second program states PV1 and PV2 may become the program inhibit cells, and thus the total number of program inhibit cells may increase. In the loop L5, the memory cells corresponding to the third program state PV3 may be changed from the program inhibit cells to the program allowable cells. Accordingly, the number of program inhibit cells may temporarily decrease in the loop L5. After the loop L5, as the number of program loops increases, the memory cells corresponding to the first to third program states PV1 to PV3 may become the program inhibit cells, and thus the total number of program inhibit cells may increase.

Figure 10B:
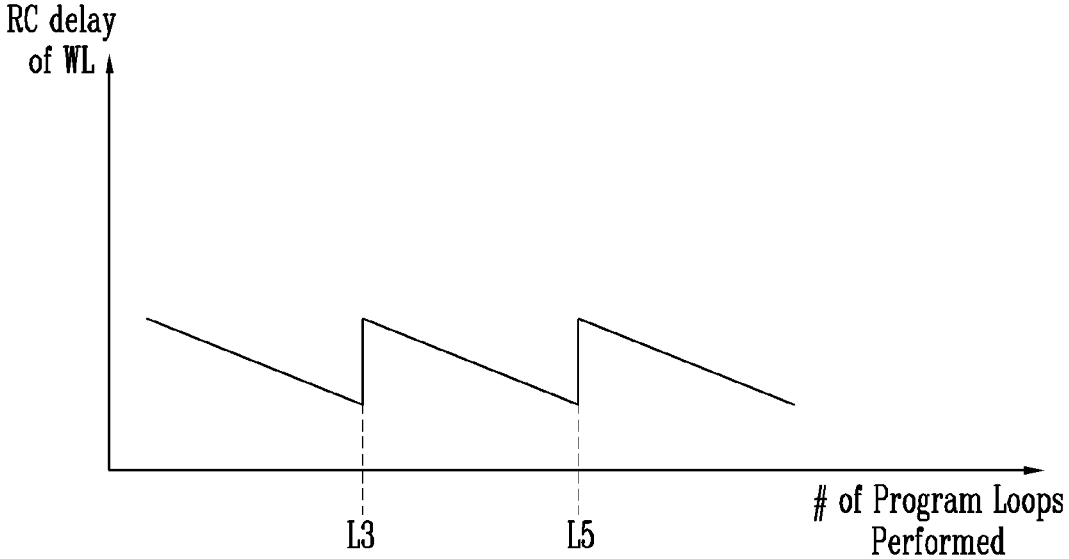
FIG. 10B is a graph illustrating an RC delay of a word line WL according to the increase of the number of program loops when the memory cells are programmed according to FIGS. 8 and 9.

FIG. 10B is a graph illustrating an RC delay of the word line WL according to the increase of the number of program loops when the memory cells are programmed according to FIGS. 8 and 9.

As shown in FIG. 10A, the number of program inhibit cells may increase before the loop L3 and then may temporarily decrease in the loop L3. Thereafter, the number of program inhibit cells may increase during the loops L3 to L5, and then the number of program inhibit cells may temporarily decrease in the loop L5. In addition, the number of program inhibit cells may gradually increase after the loop L5.

Therefore, as shown in FIG. 10B, the RC delay of the word line may gradually decrease before the loop L3, and then the RC delay of the word line may temporarily increase in the loop L3. Thereafter, the RC delay of the word line may gradually decrease during the loops L3 to L5, and then the RC delay of the word line may temporarily increase in the loop L5. In addition, the RC delay of the word line may gradually decrease after the loop L5.

Figure 10C:
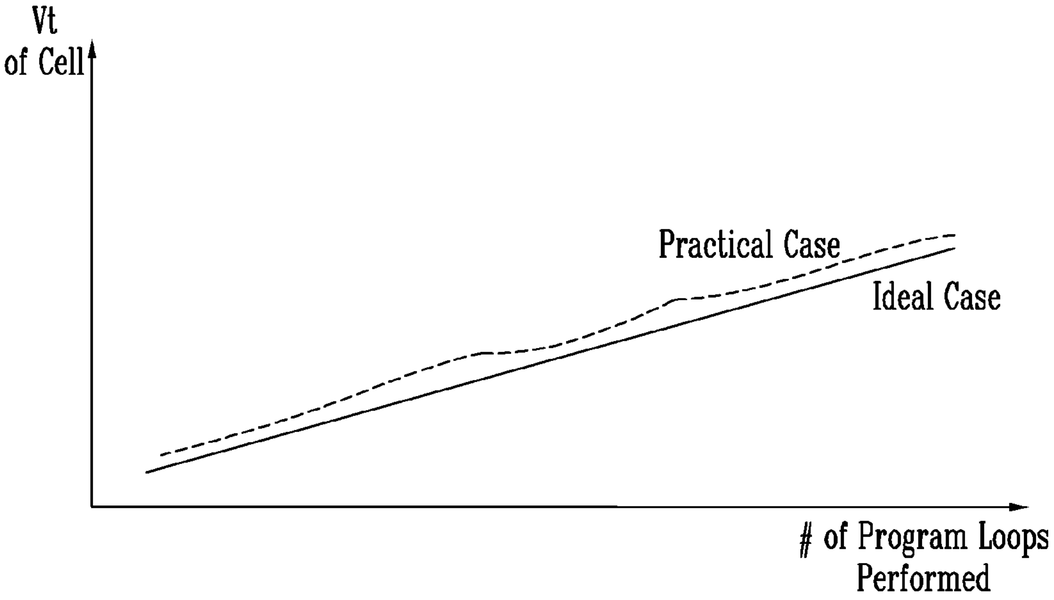
FIG. 10C is a graph illustrating a change of a threshold voltage of the memory cell according to the increase of the number of program loops when the memory cells are programmed according to FIGS. 8 and 9.

FIG. 10C is a graph illustrating a change of the threshold voltage of the memory cell according to the increase of the number of program loops when the memory cells are programmed according to FIGS. 8 and 9.

In FIG. 10C, the change of the threshold voltage of the memory cell in the ideal case is shown by a solid line. As described above, since the RC delay value of the word line is constant in the ideal case, a speed at which the threshold voltage of the memory cell increases may be gradual.

Meanwhile, as shown by a dotted line of FIG. 10C, according to the embodiment described with reference to FIGS. 8 and 9, the target program states may be divided into the first group and the second group according to the number of program loops during the program operation. Thereafter, the memory cells corresponding to the target program state belonging to the first group may be set as the program inhibit cells regardless of whether or not programming is completed. Accordingly, as shown in FIG. 10A, the number of program inhibit cells according to the increase of the number of program loops may be smoothed. Therefore, as shown in FIG. 10B, the RC delay of the word line according to the increase of the number of program loops may also be smoothed. As a result, the change of the threshold voltage of the memory cells might not be greatly different from that of the ideal case.

Figure 11:
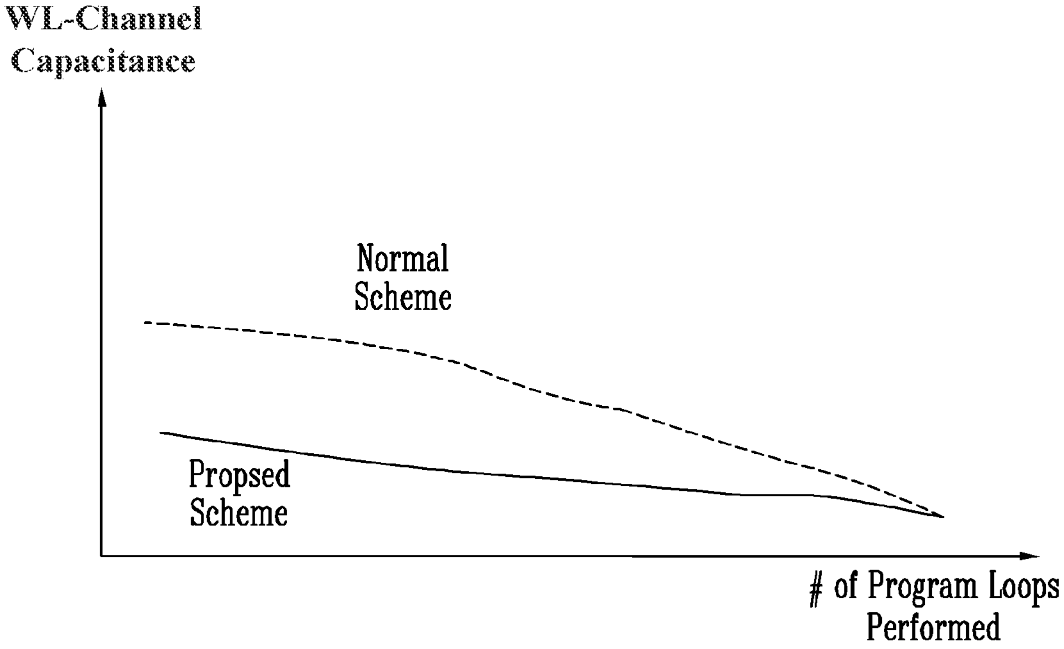
FIG. 11 is a graph illustrating a change of a capacitance between the word line and a channel according to the increase of the number of program loops when the memory cells are programmed according to FIGS. 8 and 9.

FIG. 11 is a graph illustrating a change of a capacitance between the word line and the channel according to the increase of the number of program loops when the memory cells are programmed according to FIGS. 8 and 9.

Referring to FIG. 11, the change of the capacitance between the word line and the channel according to the increase of the number of program loops when the memory cells are programmed according to a general method, that is, the method described with reference to FIG. 7 is shown by a dotted line. In addition, the change of the capacitance between the word line and the channel according to the increase of the number of program loops when the memory cells are programmed according to the method described with reference to FIGS. 8 and 9 is shown by a solid line.

As described above, when the memory cells are programmed as described with reference to FIGS. 8 and 9, the target program states may be divided into the first group and the second group according to the number of program loops during the program operation. Thereafter, the memory cells corresponding to the target program state belonging to the first group may be set as the program inhibit cells regardless of whether or not programming is completed. The capacitance between the word line and the channel may be relatively decreased during the entire program operation. Compared to the general method shown by the dotted line, a difference of the capacitance between the word line and the channel may be greatest at the beginning of the program operation, and the difference of the capacitance between the word line and the channel may be decreased toward the latter half of the program operation. This means that a difference may exist in an application time of an effective program pulse according to a progress state of the program operation. The application time of the effective program pulse is described with reference to FIGS. 12 and 13.

Figure 12:
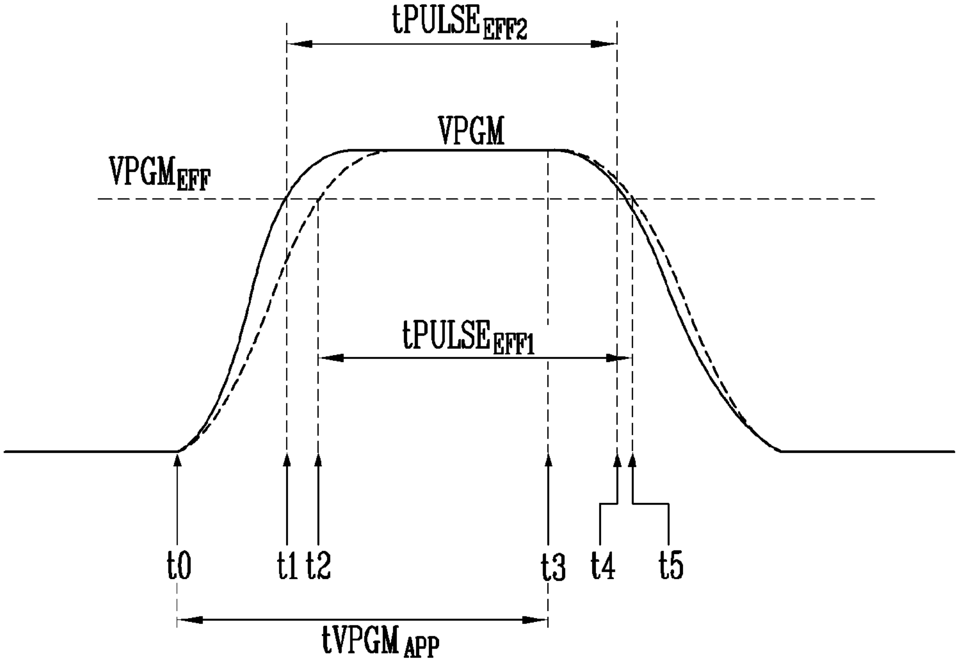
FIG. 12 is a graph illustrating an increase of an application time of an effective program pulse when the memory cells are programmed according to FIGS. 8 and 9.

FIG. 12 is a graph illustrating an increase of the application time of the effective program pulse when the memory cells are programmed according to FIGS. 8 and 9.

Referring to FIG. 12, the program pulse applied to the word line when the memory cells are programmed according to the general method, that is, the method described with reference to FIG. 7 is shown by a dotted line. In addition, the program pulse applied to the word line when the memory cells are programmed according to the method described with reference to FIGS. 8 and 9 is shown by a solid line.

First, the program pulse of a case in which the memory cells are programmed according to the method described with reference to FIG. 7 is described. At time t0, the program voltage VPGM may start to be applied to the selected word line. In this case, a voltage of the word line might not directly become the program voltage VPGM due to the RC delay of the word line. The voltage of the word line may start to increase from time t0 and may reach the program voltage VPGM after a certain time.

Thereafter, at time t3, the application of the program voltage VPGM to the selected word line may be stopped. Instead, at time t3, a ground voltage may be applied to the selected word line. In this case, the voltage of the word line may start to decrease from time t3 and may reach the ground voltage after a certain time.

A time point at which the program voltage VPGM starts to be applied to the word line may be time t0, and a time point at which the ground voltage, instead of the program voltage VPGM, starts to be applied to the word line may be time t3. Therefore, a period t0 to t3 may be referred to as "an application time $tVPGM_{APP}$ of the program voltage".

In the graph of FIG. 12, an effective program voltage $VPGM_{EFF}$ may refer to an effective voltage capable of increasing the threshold voltage of the memory cells. The effective program voltage $VPGM_{EFF}$ may be set to various values as occasion demands. As an example, the effective program voltage $VPGM_{EFF}$ may be a value corresponding to about 90% of the program voltage VPGM. As another example, the effective program voltage $VPGM_{EFF}$ may be a value corresponding to about 98% of the program voltage VPGM.

Referring to the dotted line of FIG. 12, when the memory cells are programmed according to the method described with reference to FIG. 7, the voltage of the word line may start to increase from time to and the voltage of the word line may reach the effective program voltage $VPGM_{EFF}$ at time t2. Meanwhile, the voltage of the word line may start to decrease from time t3, and the voltage of the word line may reach the effective program voltage $VPGM_{EFF}$ at time t5. Therefore, when the memory cells are programmed according to the method described with reference to FIG. 7, an application time $tPULSE_{EFF1}$ of the effective program pulse may become a period t2 to t5 in which the graph of the dotted line is greater than the effective program voltage $VPGM_{EFF}$.

Meanwhile, the program pulse of a case in which the memory cells are programmed according to the method described with reference to FIGS. 8 and 9 is described. Identically to the method described with reference to FIG. 7, the program voltage VPGM may start to be applied to the selected word line at time t0. In this case, the voltage of the word line might not directly become the program voltage VPGM due to the RC delay of the word line. In addition, at time t3, the application of the program voltage VPGM to the selected word line may be stopped, and the ground voltage may be applied to the selected word line.

Referring to the solid line of FIG. 12, when the memory cells are programmed according to the method described with reference to FIGS. 8 and 9, the voltage of the word line may start to increase from time to, and the voltage of the word line may reach the effective program voltage $VPGM_{EFF}$ at time t1. Meanwhile, the voltage of the word line may start to decrease from time t3, and the voltage of the word line may reach the effective program voltage $VPGM_{EFF}$ at time t4. Therefore, when the memory cells are programmed according to the method described with reference to FIGS. 8 and 9, an application time $tPULSE_{EFF2}$ of the effective program pulse may become a period t2 to t4 in which the graph of the dotted line is greater than the effective program voltage $VPGM_{EFF}$.

Meanwhile, the application time $tPULSE_{EFF1}$ of the effective program pulse according to the dotted line in which the RC delay time of the word line is relatively long may be shorter than the application time $tPULSE_{EFF2}$ of the effective program pulse according to the solid line in which the RC delay time is relatively short.

Figure 13:
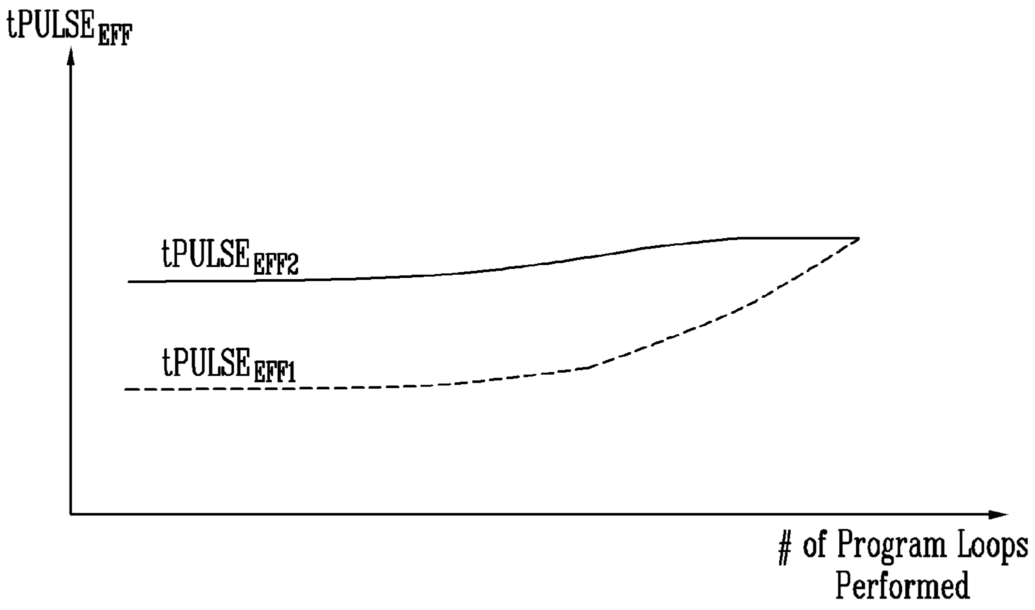
FIG. 13 is a graph illustrating a change of the application time of the effective program pulse according to the increase of the number of program loops when the memory cells are programmed according to FIGS. 8 and 9.

FIG. 13 is a graph illustrating a change of the application time of the effective program pulse according to the increase of the number of program loops when the memory cells are programmed according to FIGS. 8 and 9.

Referring to FIG. 13, the application time $tPULSE_{EFF1}$ of the effective program pulse according to the increase of the number of program loops when the memory cells are programmed according to the method described with reference to FIG. 7 is shown by a dotted line. In addition, the application time $tPULSE_{EFF2}$ of the effective program pulse according to the increase of the number of program loops when the memory cells are programmed according to the method, described with reference to FIGS. 8 and 9, is shown by a solid line.

As shown in FIG. 13, the application time $tPULSE_{EFF1}$ may be shorter than the application time $tPULSE_{EFF2}$, and a difference thereof may be the greatest at the beginning of the program operation. As the number of program loops is increased, the difference between the application time $tPULSE_{EFF1}$ and the application time $tPULSE_{EFF2}$ may decrease. That is, the application time $tPULSE_{EFF2}$ of the effective program pulse of the case in which the memory cells are programmed according to the method described with reference to FIGS. 8 and 9 may be different from the application time $tPULSE_{EFF1}$ of the effective program pulse of the case in which the memory cells are programmed according to the method described with reference to FIG. 7, which is the existing method. When the application time of the effective program pulse is different from that of the existing method, program performance of the memory cells may be deteriorated.

In accordance with a method of operating a semiconductor memory device according to an embodiment of the present disclosure, when the memory cells are programmed according to the method described with reference to FIGS. 8 and 9, an application time $tVPGM_{APP}$ of the program voltage applied to the word line may be adaptively determined. More specifically, the application time $tVPGM_{APP}$ of the program voltage applied to the word line may be set relatively short in an initial period of the program operation, and the application time $tVPGM_{APP}$ of the program voltage applied to the word line may be set relatively long in a later period of the program operation. In particular, according to the method described with reference to FIGS. 8 and 9, the application time $tVPGM_{APP}$ of the program voltage may be increased at a time point at which the program inhibit cell temporarily increases. In this case, the application time of the effective program pulse may be set similarly to the existing method.

Figure 14:
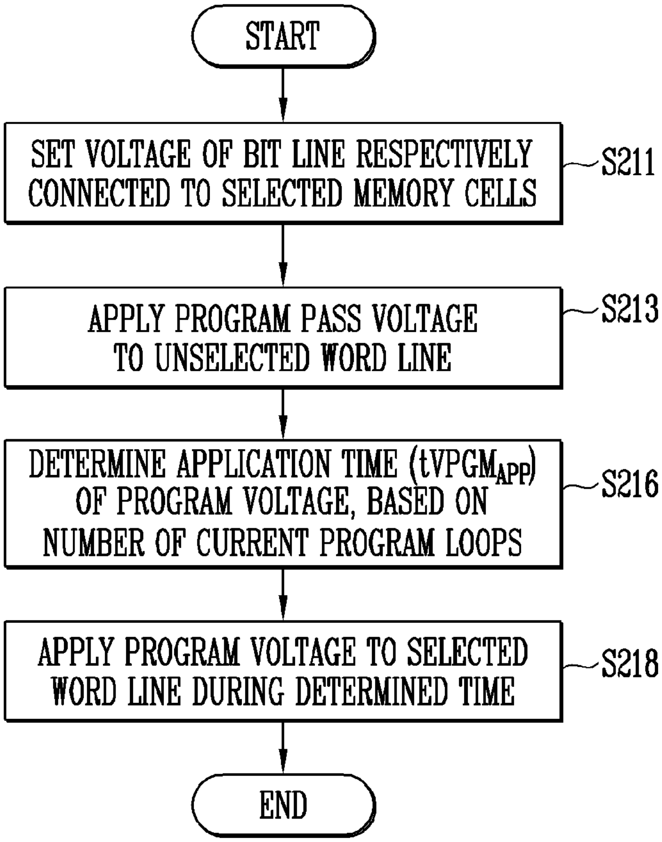
FIG. 14 is a flowchart illustrating another embodiment of step S210 of FIG. 4.

FIG. 14 is a flowchart illustrating another embodiment of step S210 of FIG. 4.

Referring to FIG. 14, applying the program pulse to the selected the memory cells may include setting a voltage of a bit line connected to the selected the memory cells (S211), applying a program pass voltage to an unselected word line (S213), determining an application time $tVPGM_{APP}$ of a program voltage based on the number of current program loops (S216), and applying the program voltage to the selected word line during the determined time (S218).

In step S211, the voltage of the bit line respectively connected to the selected the memory cells is set. According to an embodiment of the present disclosure, in step S211, the voltage of the bit line may be set according to the method described with reference to FIGS. 8 and 9.

In step S213, the program pass voltage may be applied to the unselected word line. Among the word lines connected to the memory block including the selected the memory cells, the word lines connected to the selected the memory cells may become the selected word lines, and other word lines may become the unselected word lines. As the program pass voltage is applied to the unselected word lines, the threshold voltage of the memory cells connected to the unselected word lines might not change.

In step S216, the application time $tVPGM_{APP}$ of the program voltage may be determined based on the number of current program loops. Specifically, when the number of current program loops is relatively small, the application time $tVPGM_{APP}$ of the program voltage applied to the word line may be determined to be relatively short. In addition, when the number of current program loops is relatively large, the application time $tVPGM_{APP}$ of the program voltage applied to the word line may be determined to be relatively long. A specific embodiment of step S216 is described later with reference to FIG. 15.

In step S218, the program voltage may be applied to the selected word line during the determined time. Specifically, during the application time $tVPGM_{APP}$ of the program voltage determined in step S216, the program voltage VPGM may be applied to the selected word line. According to step S218, the threshold voltage of the program allowable cell connected to the bit line to which the program allowable voltage is applied, among the selected the memory cells, may increase. In addition, the threshold voltage of the program inhibit cell connected to the bit line to which the program inhibit voltage is applied, among the selected the memory cells, may be maintained.

Figure 15:
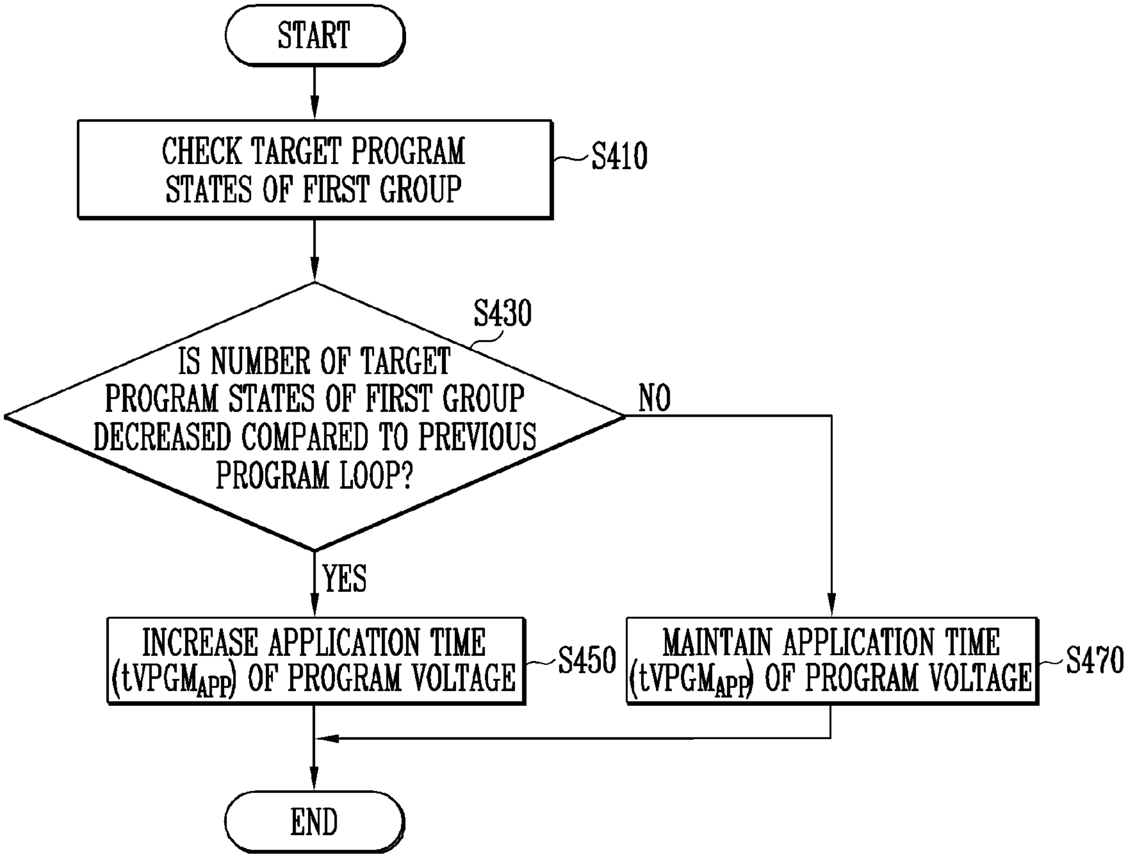
FIG. 15 is a flowchart illustrating an embodiment of step S216 of FIG. 14.

FIG. 15 is a flowchart illustrating an embodiment of step S216 of FIG. 14.

Referring to FIG. 15, step S216 of FIG. 14 may include checking target program states of a first group (S410), determining whether the number of target program states of the first group is decreased compared to a previous program loop (S430), increasing an application time $tVPGM_{APP}$ of a program voltage (S450) when the number of target program states of the first group decreases (S430: Yes), and maintaining the application time $tVPGM_{APP}$ of the program voltage (S470) when the number of target program states of the first group does not decrease (S430: No).

In an example with reference to FIG. 9, the number of target program states of the first group may decrease in the loop L3 and the loop L5. That is, in initial program loops before the loop L3, the application time $tVPGM_{APP}$ of the program voltage may have a relatively small initial value.

In the loop L3, the second program state PV2 may be excluded from the target program states of the first group. Accordingly, since the number of target program states of the first group decreases (S430: Yes), the application time $tVPGM_{APP}$ of the program voltage may be increased in the loop L3. On the other hand, since the number of target program states of the first group is maintained to the loop L5 after the loop L3 (S430: No), the application time $tVPGM_{APP}$ of the program voltage may also be maintained.

In the loop L4, the third program state PV3 may be excluded from the target program states of the first group. Accordingly, since the number of target program states of the first group decreases (S430: Yes), the application time $tVPGM_{APP}$ of the program voltage may be increased in the loop L5. On the other hand, since the number of target program states of the first group is maintained after the loop L5 (S430: No), the application time $tVPGM_{APP}$ of the program voltage may also be maintained.

Figure 16:
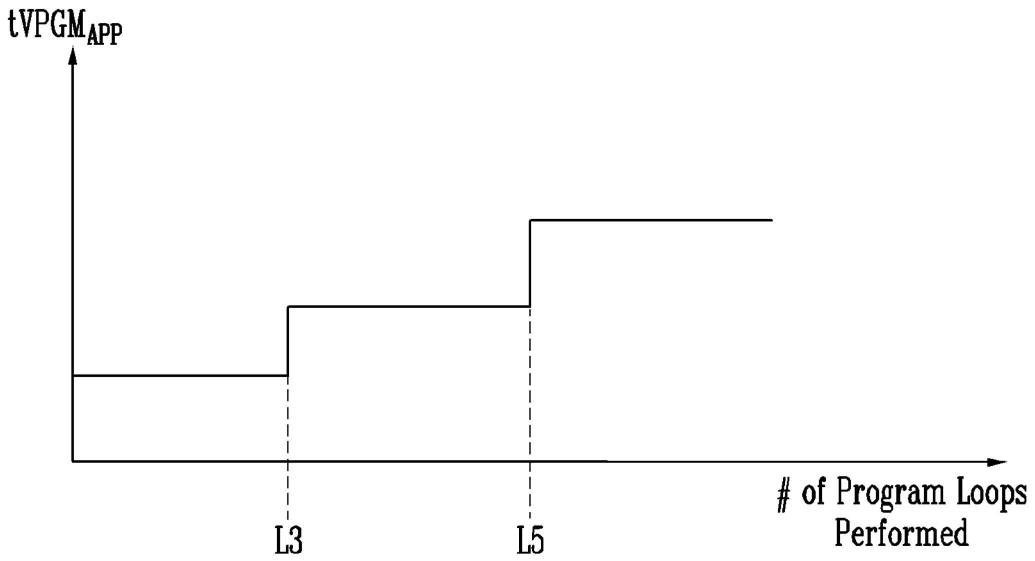
FIG. 16 is a graph illustrating an example of determining an application time of a program voltage according to a change of the number of program loops according to the embodiment shown in FIGS. 14 and 15.

FIG. 16 is a graph illustrating an example of determining the application time of the program voltage according to a change of the number of program loops according to the embodiment, shown in FIGS. 14 and 15.

As described above with reference to FIG. 15, in the initial program loops before the loop L3, the application time $tVPGM_{APP}$ of the program voltage may have a relatively small initial value.

Since the number of target program states of the first group decreases in the loop L3 (S430: Yes), the application time $tVPGM_{APP}$ of the program voltage may increase in the loop L3. In addition, since the number of target program states of the first group is maintained to the loop L5 after the loop L3 (S430: No), the application time $tVPGM_{APP}$ of the program voltage may also be maintained.

Since the number of target program states of the first group decreases again in the loop L5 (S430: Yes), the application time $tVPGM_{APP}$ of the program voltage may increase in the loop L5. In addition, since the number of target program states of the first group is maintained after the loop L5 (S430: No), the application time $tVPGM_{APP}$ of the program voltage may also be maintained.

Figure 17:
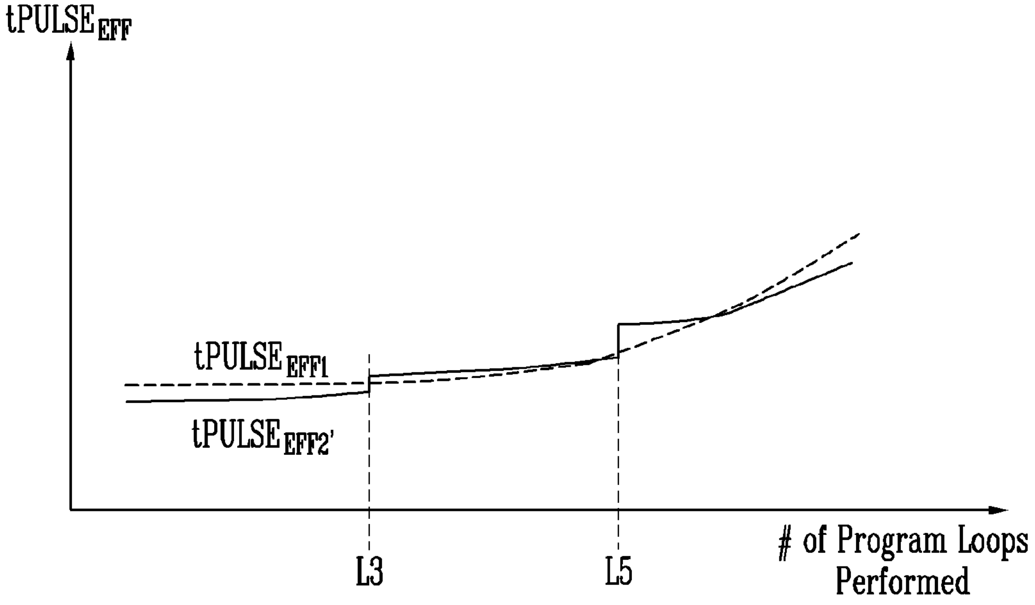
FIG. 17 is a graph illustrating a change of the application time of the effective program pulse according to the increase of the number of program loops when the memory cells are programmed according to FIGS. 14 and 15.

FIG. 17 is a graph illustrating the change of the application time of the effective program pulse according to the increase of the number of program loops when the memory cells are programmed according to FIGS. 14 and 15.

Referring to FIG. 17, the application time $tPULSE_{EFF1}$ of the effective program pulse according to the increase of the number of program loops when the memory cells are programmed according to the method described with reference to FIG. 7 is shown by a dotted line. In addition, an application time $tPULSE_{EFF2'}$ of the effective program pulse according to the increase of the number of program loops of a case in which the application time of the program voltage is determined according to the embodiment shown in FIGS. 14 and 15 while the memory cells are programmed according to the method described with reference to FIGS. 8 and 9 is shown by a solid line.

As shown in FIG. 17, when the application time of the program voltage is determined according to the embodiment shown in FIGS. 14 and 15, the application time $tPULSE_{EFF2'}$ of the effective program pulse may become similar to the application time $tPULSE_{EFF1}$ of the effective program pulse when the memory cells are programmed according to the method described with reference to FIG. 7, which is the existing method. Accordingly, deterioration of program performance of the memory cells may be minimized.

What is claimed is:

1. A semiconductor memory device comprising:
- a memory block including a plurality of memory cells;
- a peripheral circuit configured to perform a program operation including a plurality of program loops on selected memory cells, among the plurality of memory cells; and
- a control logic, in a process of setting a voltage of a bit line connected to the selected memory cells during the program operation, configured to control the peripheral circuit to apply a program inhibit voltage to a bit line connected to first memory cells corresponding to a target program state of a first group determined by a number of current program loops, the first memory cells being not programmed to the target program state of the first group, apply the program inhibit voltage to a bit line connected to memory cells on which programming is determined to be completed in a previous program loop, among second memory cells corresponding to a target program state of a second group determined by the number of current program loops, and apply a program allowable voltage to a bit line connected to memory cells on which programming is determined to not be completed in the previous program loop, among the second memory cells corresponding to the target program state of the second group determined by the number of current program loops.

2. The semiconductor memory device of claim 1, wherein, in a process of applying a program voltage to a selected word line connected to the selected memory cells during the program operation, the control logic determines an application time of the program voltage based on the number of current program loops, and the peripheral circuit applies the program voltage to the selected word line during the determined application time.

3. The semiconductor memory device of claim 1, wherein a threshold voltage of the selected memory cells belongs to any one of an erase state and first to N-th program states by the program operation, and wherein the control logic:
- set the target program states of the first and second groups so that the target program state of the first group includes the second to N-th program states, and the target program state of the second group includes the first program state during first to A-th program loops, and
- set the target program states of the first and second groups so that the target program state of the first group includes the third to N-th program states, and the target program state of the second group includes the first and second program states during (A+1)-th to B-th program loops, and wherein N is a natural number equal to or greater than 3, A is a natural number equal to or greater than 2, and B is a natural number greater than A.

4. The semiconductor memory device of claim 3, wherein the control logic sets the target program states of the first and second groups so that the target program state of the first group includes the fourth to N-th program states, and the target program state of the second group includes the first to third program states during (B+1)-th to C-th program loops, and wherein N is a natural number equal to or greater than 4, and C is a natural number equal to or greater than 4.

5. The semiconductor memory device of claim 2, wherein the peripheral circuit applies the program voltage to the selected word line during a relatively short time as the number of current program loops is relatively small and applies the program voltage to the selected word line during a relatively long time as the number of current program loops is relatively large.

6. The semiconductor memory device of claim 2, wherein the control logic changes the application time of the program voltage when the number of target program states of the first group is changed.

7. The semiconductor memory device of claim 6, wherein the peripheral circuit increases the application time during which the program voltage is applied to the selected word line when the number of target program states of the first group decreases.

8. A method of operating a memory device, the method comprising:
- applying a program pulse to selected memory cells in a state in which first memory cells corresponding to a target program state of a first group determined by a number of current program loops, among a plurality of program loops, are set as program inhibit cells, the first memory cells being not programmed to the target program state of the first group; and
- performing a verify operation on the selected memory cells.

9. The method of claim 8, wherein, in applying the program pulse to the selected memory cells, a program voltage is applied to a selected word line connected to the selected memory cells during a time determined by the number of current program loops.

10. The method of claim 9, wherein applying the program pulse to the selected memory cells comprises:
- setting a voltage of a bit line respectively connected to the selected memory cells to set the first memory cells, corresponding to the target program state of a first group determined by the number of current program loops, as the program inhibit cells;
- applying a program pass voltage to an unselected word line other than the selected word line; and
- applying a program voltage to the selected word line.

11. The method of claim 10, wherein applying the program voltage to the selected word line comprises:
- determining an application time of the program voltage based on the number of current program loops; and
- applying the program voltage to the selected word line during the determined application time of the program voltage.

12. The method of claim 11, wherein determining the application time of the program voltage based on the number of current program loops comprises:

checking target program states of the first group; and increasing the application time of the program voltage when the number of target program states of the first group decreases compared to a previous program loop.

13. The method of claim 11, wherein determining the application time of the program voltage based on the number of current program loops comprises:

checking target program states of the first group; and maintaining the application time of the program voltage when the number of target program states of the first group does not decrease compared to a previous program loop.

14. The method of claim 10, wherein setting the voltage of the bit line respectively connected to the selected memory cells comprises:

applying a program inhibit voltage to the bit line connected to the first memory cells corresponding to the target program state of the first group determined by the number of current program loops;

applying the program inhibit voltage to a bit line connected to memory cells on which programming is determined to be completed in a previous program loop, among second memory cells corresponding to a target program state of a second group determined by the number of current program loops; and applying a program allowable voltage to a bit line connected to memory cells on which the programming is determined to not be completed in the previous program loop, among the second memory cells corresponding to the target program state of the second group determined by the number of current program loops.

15. The method of claim 14, wherein setting the voltage of the bit line respectively connected to the selected memory cells further comprises applying a program inhibit voltage to a bit line connected to memory cells corresponding to an erase state.

16. The method of claim 14, wherein a threshold voltage of the selected memory cells belong to any one of an erase state and first to N-th program states by the program operation, wherein, when the current program loop is first to A-th program loops, the target program state of the first group includes the second to N-th program state, and the target program state of the second group includes the first program state, and wherein N is a natural number equal to or greater than 3, and A is a natural number equal to or greater than 2.

17. The method of claim 16, wherein, when the current program loop is (A+1)-th to B-th program loops, the target program state of the first group includes the third to N-th program state, and the target program state of the second group includes the first and second program states, and wherein B is a natural number greater than A.

18. The method of claim 17, wherein, when the current program loop is (B+1)-th to C-th program loops, the target program state of the first group includes the fourth to N-th program state, and the target program state of the second group includes the first to third program states, and wherein N is a natural number equal to or greater than 4, and C is a natural number equal to or greater than 4.

* * * * *